United States Patent
Parois-Quelennec et al.

(10) Patent No.: US 11,169,197 B2
(45) Date of Patent: Nov. 9, 2021

(54) DEVICE FOR MONITORING THE INSULATION AND/OR CONTINUITY OF AT LEAST ONE ELECTRIC CABLE AND ASSOCIATED MONITORING METHOD

(71) Applicant: NAVAL GROUP, Paris (FR)

(72) Inventors: Eric Parois-Quelennec, La Montagne (FR); Richard Cheruel, La Montagne (FR)

(73) Assignee: Naval Group, Paris (FR)

(*) Notice: Subject to any disclaimer, the term of this patent is extended or adjusted under 35 U.S.C. 154(b) by 0 days.

(21) Appl. No.: 16/645,063

(22) PCT Filed: Sep. 7, 2018

(86) PCT No.: PCT/EP2018/074184
§ 371 (c)(1),
(2) Date: Mar. 6, 2020

(87) PCT Pub. No.: WO2019/048627
PCT Pub. Date: Mar. 14, 2019

(65) Prior Publication Data
US 2021/0165033 A1 Jun. 3, 2021

(30) Foreign Application Priority Data
Sep. 8, 2017 (FR) ...................................... 17 00904

(51) Int. Cl.
*G01R 31/12* (2020.01)
*G01R 31/50* (2020.01)
(Continued)

(52) U.S. Cl.
CPC ......... *G01R 31/1272* (2013.01); *G01R 31/50* (2020.01); *G01R 31/52* (2020.01); *G01R 31/54* (2020.01); *G01R 31/60* (2020.01)

(58) Field of Classification Search
CPC .... G01R 31/1272; G01R 31/54; G01R 31/60; G01R 31/52
See application file for complete search history.

(56) References Cited

U.S. PATENT DOCUMENTS 3,430,135 A * 2/1969 Mullen ................. G01R 31/58
324/540
3,594,635 A * 7/1971 Minamii ................ G01R 31/58
324/541
(Continued)

*Primary Examiner* — Patrick Assouad
*Assistant Examiner* — Demetrius R Pretlow
(74) *Attorney, Agent, or Firm* — Thompson Coburn LLP; Steven M. Ritchey

(57) ABSTRACT

The invention concerns a device for monitoring the insulation and/or continuity of at least one electric cable including a plurality of electrical wires, wherein the device comprises a measuring circuit that can be connected to the electrical wires, wherein the measuring circuit comprises:
- a measuring stage comprising a voltage generator;
- a switching stage that can be connected to the measuring stage, suited to connect each electrical wire automatically and successively to the measuring circuit and/or suited to connect the measuring circuit to ground;
- a looping stage of the measuring circuit that can be connected, electrical wire to electrical wire, to the switching stage;

Figure 1:
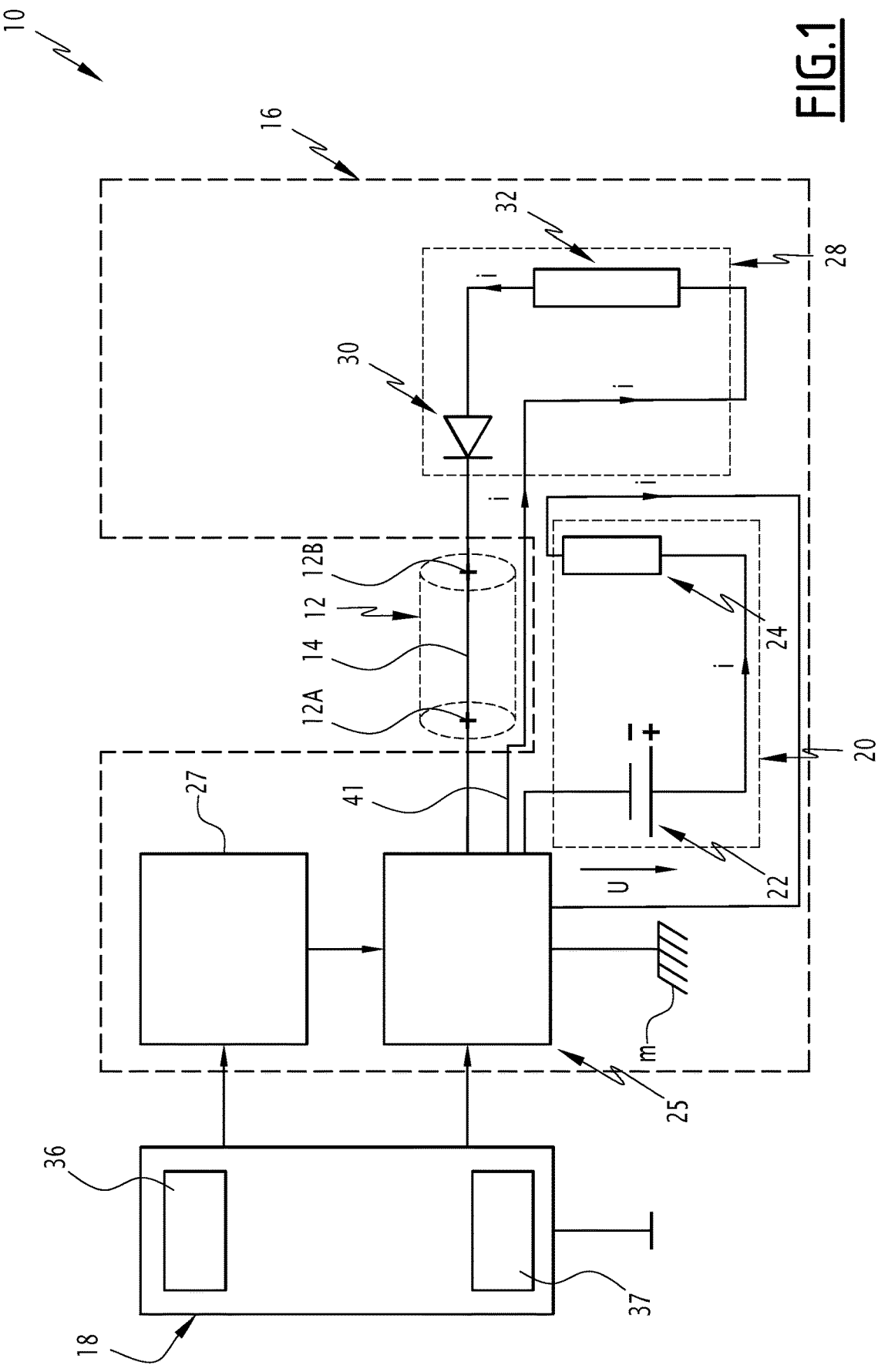

wherein the looping stage is configured to operate automatically in at least one of two modes, insulating or resistive, respectively associated with the monitoring of the insulation or the monitoring of the continuity.

11 Claims, 4 Drawing Sheets

(51) Int. Cl.
*G01R 31/52* (2020.01)
*G01R 31/54* (2020.01)
*G01R 31/60* (2020.01)

(56) References Cited

U.S. PATENT DOCUMENTS

| | | | | |
|---|---|---|---|---|
| 3,600,673 | A * | 8/1971 | Kohke | G01R 31/58 324/540 |
| 3,986,106 | A * | 10/1976 | Shuck | G01R 31/58 324/540 |
| 3,986,107 | A * | 10/1976 | Dickson | G01R 27/025 324/551 |
| 4,015,200 | A * | 3/1977 | Strandh | G01R 31/50 324/540 |
| 4,042,878 | A * | 8/1977 | Peterson | G01R 31/58 324/556 |
| 4,277,740 | A * | 7/1981 | Parks | G01R 31/60 324/540 |
| 4,375,050 | A * | 2/1983 | Helgerson | G01R 31/58 324/540 |
| 4,384,249 | A * | 5/1983 | Medina | G01R 31/54 324/540 |
| 4,399,400 | A * | 8/1983 | Rockwell | G01R 31/60 324/540 |
| 4,418,312 | A * | 11/1983 | Figler | G01R 31/54 324/540 |
| 4,445,086 | A * | 4/1984 | Bulatao | G01R 31/60 324/66 |
| 4,446,421 | A * | 5/1984 | Berde | G01R 31/088 324/523 |
| 4,471,293 | A * | 9/1984 | Schnack | G01R 31/60 324/540 |
| 4,524,321 | A * | 6/1985 | Jablway | G01R 31/60 324/66 |
| 4,651,084 | A * | 3/1987 | Welsh | G01R 31/54 324/523 |
| 4,689,551 | A * | 8/1987 | Ryan | G01R 31/58 324/539 |
| 4,835,479 | A * | 5/1989 | Haines | G01R 31/58 324/540 |
| 5,155,440 | A | 10/1992 | Huang | |
| 5,231,357 | A * | 7/1993 | Moody | G01R 31/52 324/539 |
| 5,414,343 | A * | 5/1995 | Flaherty | G01R 31/58 324/66 |
| 5,436,554 | A * | 7/1995 | Decker, Jr. | G01R 31/52 324/66 |
| 5,559,427 | A * | 9/1996 | Hinds | H04L 43/50 324/66 |
| 6,512,378 | B2 * | 1/2003 | Fernandez | H04B 3/46 324/538 |
| 6,515,484 | B1 * | 2/2003 | Bald | G01R 31/1227 324/551 |
| 6,559,651 | B1 * | 5/2003 | Crick | G01R 31/52 324/522 |
| 6,907,363 | B1 * | 6/2005 | Wyant | G01R 27/18 702/122 |
| 6,927,579 | B2 * | 8/2005 | Blades | G01R 1/07 324/535 |
| 8,103,475 | B2 * | 1/2012 | Sorensen | G01R 31/50 702/120 |
| 8,395,393 | B2 * | 3/2013 | Betz | G01R 31/31855 324/539 |
| 2009/0273350 | A1 * | 11/2009 | Archer | G01R 31/54 324/522 |
| 2015/0084643 | A1 * | 3/2015 | Yamashita | G01R 31/2812 324/551 |

* cited by examiner

DEVICE FOR MONITORING THE INSULATION AND/OR CONTINUITY OF AT LEAST ONE ELECTRIC CABLE AND ASSOCIATED MONITORING METHOD

CROSS-REFERENCE TO RELATED APPLICATIONS

This application is a U.S. National Phase application of PCT/EP2018/074184 filed on Sep. 7, 2018, claiming the benefit of French Application No. 17 00904, filed on Sep. 8, 2017, both of which are incorporated herein by reference in their entireties.

This invention concerns a monitoring device and method for monitoring the insulation and/or continuity of at least one electrical cable comprising a plurality of electrical wires.

For example, the invention concerns the field of naval vessels.

The electrical insulation and/or continuity of cables on board naval vessels must be regularly monitored.

Naval vessels comprise a very large number of cables to be tested.

There are devices for monitoring the insulation and/or continuity of electrical cables that necessitate numerous manipulations by operators in order to carry out the measurements.

In particular, the operator must manually connect the electrical wires of the cable, one by one, to the monitoring device, and manually enter the measurement settings.

It takes a relatively long time to test the insulation and/or continuity of the electrical wires of the cable and any measurement errors.

Additionally, the continuity and/or insulation of cables must be tested in cramped spaces.

Thus, this is relatively inconvenient for the operator.

One objective of this invention is to propose a device for monitoring the insulation and/or continuity of at least one electrical cable that allows for the insulation and/or continuity measurement process to be simplified.

To this end, this invention concerns a monitoring device for monitoring the insulation and/or continuity of at least one electrical cable including a plurality of electrical wires, the device comprising a measuring circuit that can be connected to the electrical wires of the cable, the measuring circuit comprising:
  a measuring stage comprising at least one voltage generator;
  a switching stage that can be connected to the measuring stage, suited to connect each electrical wire automatically and successively to the measuring circuit and/or suited to connect the measuring circuit to ground;
  a looping stage of the measuring circuit that can be connected, electrical wire to electrical wire of the cable, to the switching stage;
the looping stage being configured to operate automatically in at least one of two modes, insulating or resistive, respectively associated with the monitoring of the insulation or the monitoring of the continuity of the electrical cable.

The device according to the invention may comprise one or more of the following features, taken individually or in all combinations technically feasible:
  the polarity of the looping stage in the insulating mode is the reverse of the polarity of the looping stage in the resistive mode;
  for each wire, the looping stage comprises at least one component for the unidirectional passage of electrical current, wherein each component for the unidirectional passage of electrical current is turned on when the looping stage is in the resistive mode and is blocked when the looping stage is in the insulating mode;
  for each wire the looping stage comprises at least one resistor with the at least one unidirectional component;
  the switching stage comprises electronic switches, in particular CMOS switches;
  the electronic switches are automatically controlled by a shift register;
  the measuring stage comprises, connected in series to the voltage generator, a measuring resistor, wherein the voltage at the terminals of the measuring resistor being suited to be measured and representative of the quality of the insulation and/or the continuity of each electrical wire of the cable;
  the voltage generator is a variable voltage generator;
  the monitoring device is transported manually and comprises a battery, and
  the voltage generator is galvanically isolated from the electrical assembly (i.e. electrical system) comprising the cables to be tested, which results in galvanic isolation of the voltage generator from the electrical system of the naval vessel.

The invention also concerns a method for monitoring the insulation and/or continuity of at least one electrical cable including a plurality of electrical wires, the method being automatically carried out by a monitoring device as described above, wherein the monitoring device comprises a measuring circuit that can be connected to the electrical wires of the cable, the measuring circuit comprising:
  a measuring stage comprising at least one voltage generator;
  a switching stage, that can be connected to the measuring stage, suited to connect each electrical wire automatically and successively to the measuring circuit;
  a looping stage of the measuring circuit that can be connected wire to wire to the switching stage;
  the method comprising the following steps, carried out automatically by the monitoring device:
    receipt of input data via an interface of the monitoring device,
    depending on the value of the input data, automatically activating at least one of two modes of the looping stage, insulating or resistive, respectively associated with the monitoring of the insulation or the monitoring of the continuity of the electrical cable,
    measuring the voltage at the terminals of a measuring resistor of the measuring stage, after the successive connection of each electrical wire of the at least one cable to the measuring circuit by the switching stage of the measuring circuit until an insulation and/or continuity failure of the electrical wire is detected, or until all of the electrical wires of the said at least one cable are connected.

Figure 2:
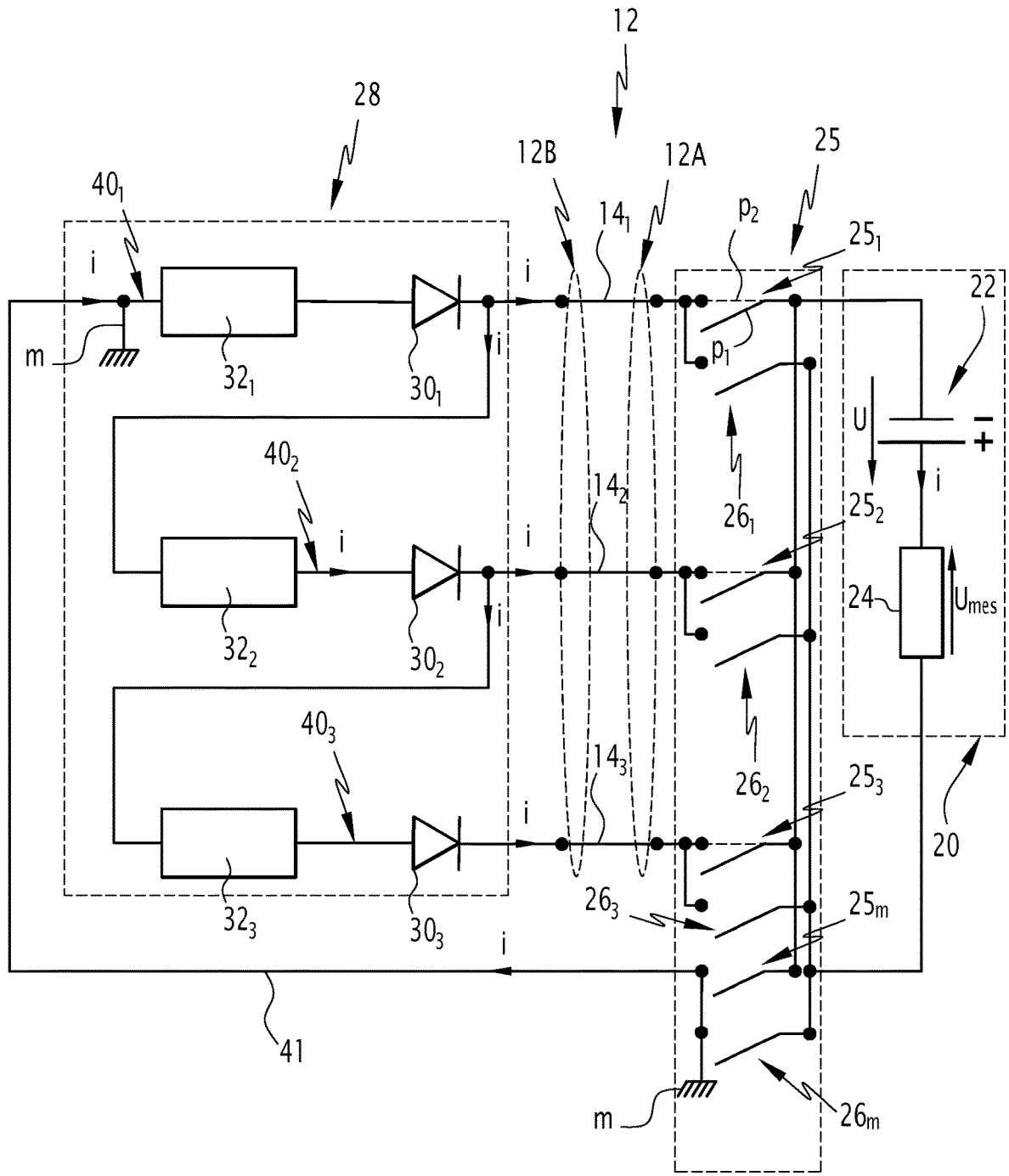
Figure 3:
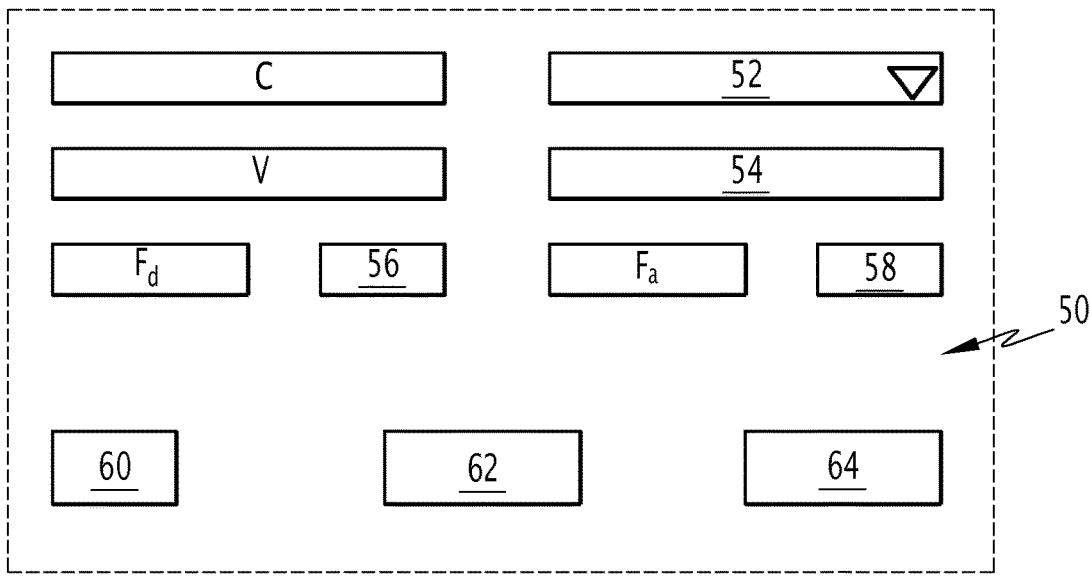
Figure 4:
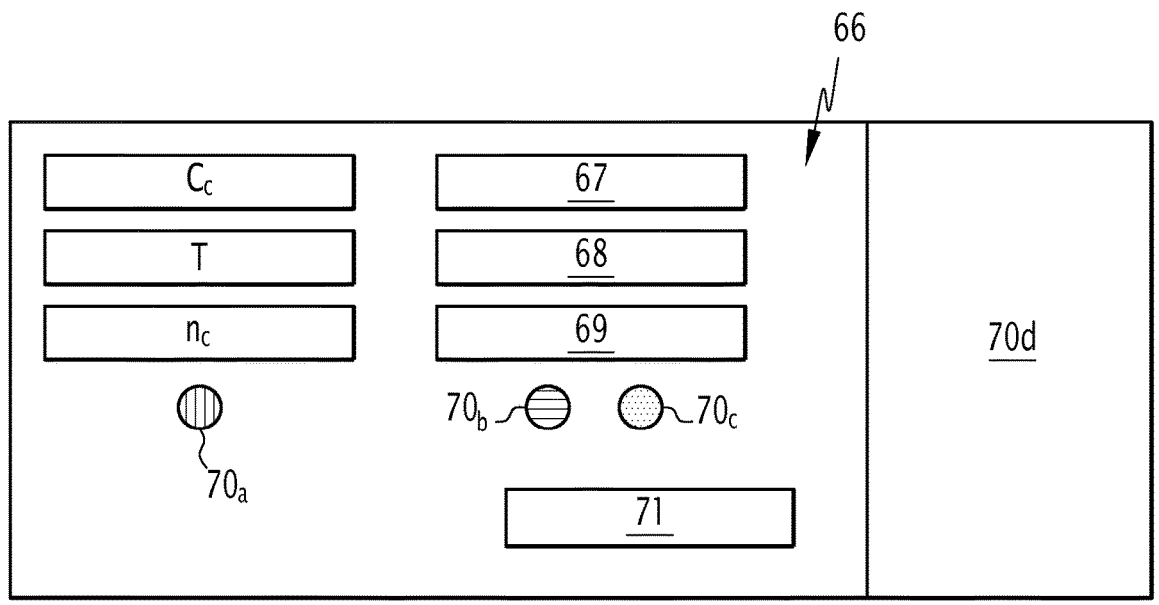
Figure 5:
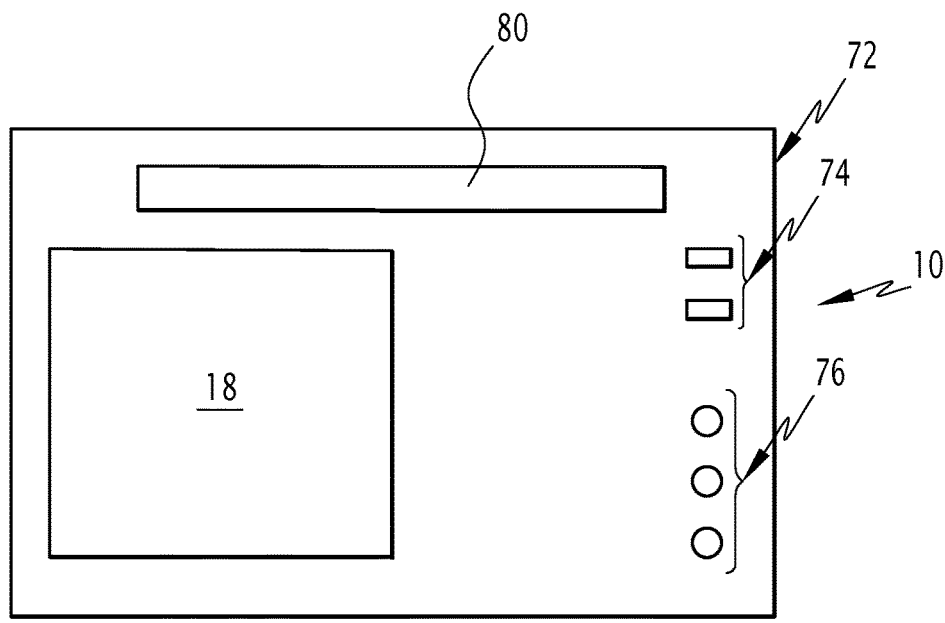
Figure 6:
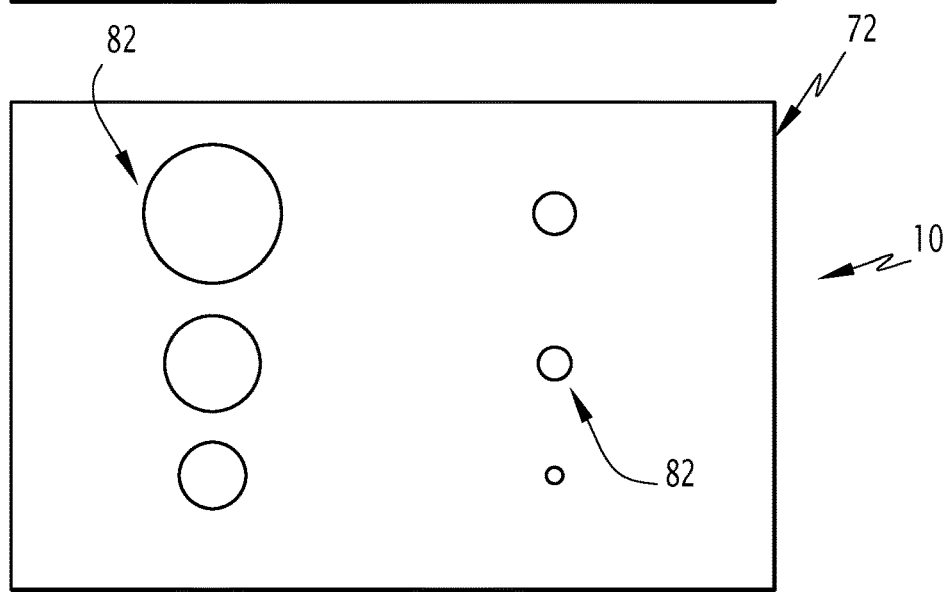
Figure 7:
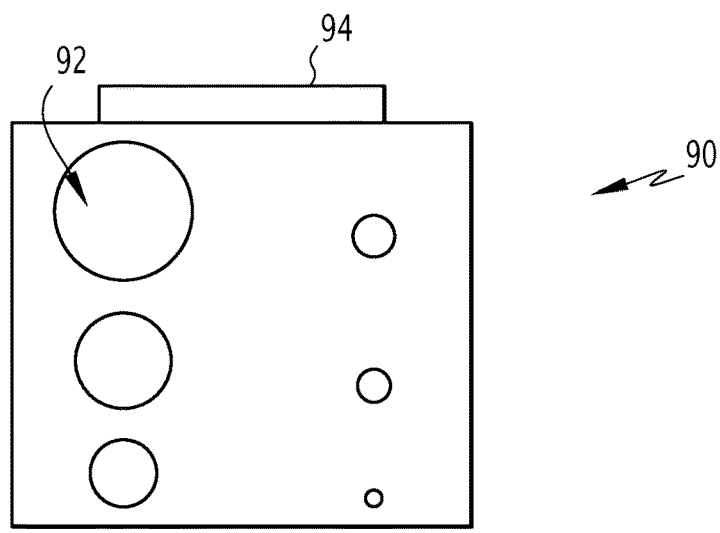

The invention will be better understood based on the following description, which is provided by way of example only and without limitation, and by reference to the attached drawings, which show:

FIG. 1 is a mimic diagram of a device for monitoring insulation and/or continuity according to the invention, FIG. 2 is a schematic view of a measuring circuit of the monitoring device according to the invention, FIG. 3 is a view of a human-machine interface suited to be displayed on a user interface of the device of FIG. 1, FIG. 4 is a view of another human-machine interface suited to be displayed on a user interface of the device of FIG. 1, FIG. 5 is a schematic view of the front surface of a first housing of the monitoring device of FIG. 1, FIG. 6 is a schematic view of the rear surface of the first housing of FIG. 5, and FIG. 7 is a front view of a second housing of the monitoring device of FIG. 1.

FIG. 1 is a mimic diagram of a device 10 for monitoring the electrical insulation and/or continuity of an electrical cable 12, suited to test the electrical insulation and continuity of the electrical cable 12.

As is known, the electrical cable 12 comprises a plurality k of electrical wires 14. For example, the electrical cable 12 comprises up to 63 electrical wires, in which case, k=63. In order to simplify this description, only a single electrical wire 14 of the cable 12 is shown in FIG. 1.

Testing the insulation of the electrical cable 12 consists of testing the electrical insulation of the conductive electrical wires 14 of the cable 12 from one another, as well as the electrical insulation between each electrical wire and ground m.

Testing the continuity of the electrical cable 12 consists of testing the electrical continuity of at least one wire 14 of the cable 12, i.e. testing that the current i circulates over the entire length of the wire 14 between its two ends.

The monitoring device 10 comprises a measuring circuit 16 that can be connected between the two terminals of each electrical wire 14 of the cable 12 and a user interface 18 connected to the measuring circuit 16 that allows for measurement information to be conveyed to the user.

The measuring circuit 16 comprises a measuring stage 20 comprising at least one voltage generator 22 and a measuring resistor 24 connected in series to the voltage generator 22.

In this example, the voltage generator 22 of the measuring stage 20 is a variable voltage generator, for example, having a voltage U of up to 500 V. For example, various voltages U, of 50 V, 250 V, 500 V, can be generated by this same variable voltage generator. The measuring resistor 24 has a value Rmes of 20.2 MΩ. For example, the measuring resistor 24 comprises a first 200 KΩ resistor and a second 20 MΩ resistor, mounted on a divider bridge, such that the voltage at the terminals of the weaker of the two resistors, i.e. the second resistor, is proportional to the fault current i circulating between two wires during an insulation measurement.

The voltage at the terminals of the weakest of the two resistors forming the measuring resistor 24 is always less than 5 V, the maximum measurement range for the acquisition stages no matter the test voltage, i.e. the voltage generated by the variable voltage generator and the serially connected fault resistor, i.e. the first resistor.

The measuring circuit 16 further comprises a switching stage 25 connected to the measuring stage 20 and a first end 12A of the electrical cable 12. The switching stage 25 is suitable for connecting each electrical wire 14 of the cable 12 automatically and successively to the measuring circuit 16 and/or the measuring circuit 16 to ground m.

The switching stage 25 comprises switches $25_1$, $25_2$, $25_3$, $25_m$, $26_1$, $26_2$, $26_3$, $26_m$ (shown in FIG. 2), such as electronic switches, for example CMOS (Complementary Metal Oxide Semiconductor) switches.

For example, the switches $25_1$, $25_2$, $25_3$, $25_m$, $26_1$, $26_2$, $26_3$, $26_m$ are incorporated into commutation cards, for example four commutation cards, each including a shift register suitable for controlling control the switches of the card. A shift register, as is known, comprises a group of synchronous latches suited to transmit a control signal to the switches $25_1$, $25_2$, $25_3$, $25_m$, $26_1$, $26_2$, $26_3$, $26_m$.

As shown in FIG. 1, the switching stage 25 is connected to a first end 12A of the cable 12, in particular to a first terminal of the wire 14.

The measuring circuit 16 further comprises a sequencer 27 connected to the switching stage 25 and suitable for monitoring the switching stage 25.

The sequencer 27 comprises a microcontroller of known type (not shown), such as a programmable microcontroller. In particular, the microcontroller comprises a central processing unit (CPU), a program memory, and a data memory suitable for processing calculation results, and input and output ports suitable for connecting the microcontroller to the other elements of the monitoring device 10, in particular the measuring stage 20.

A programmable microcontroller is a sequential logic circuit operating at the rhythm of a clock signal.

Thus, with each clock pulse, the number represented by the synchronous latches of the shift registers of the commutation cards is updated, and a control signal is to be sent to the switches to connect and disconnect an electrical wire 14 or ground m from the measuring circuit 16.

The measuring circuit 16 also comprises a looping stage 28 suitable for being connected to a second end 12B of the cable 12.

The looping stage 28 is configured to operate automatically in at least one of two modes, insulating or resistive, respectively associated with the monitoring of the insulation or the monitoring of the continuity of the electrical cable 12.

For each electrical wire 14, the looping stage 28 comprises at least one component for unidirectional passage of electrical current, such as a diode 30, for example a rectifier diode, and a resistor 32.

Thus, as shown in FIG. 1, the second terminal of the wire 14 is connected to a diode 30 and a resistor 32, which in this example are mounted in series to the diode 30.

The user interface 18 is connected to the sequencer 27 and the switching stage 25 of the measuring circuit 16.

The user interface 18 comprises a screen 36, such as a touchscreen, and optionally a keyboard 37 with which a user can enter the value of input data of the monitoring device 10. For example, the keyboard 37 is a touch keyboard intended to be displayed on the touchscreen 36.

By reference to FIG. 2, the measuring circuit 16 of the monitoring device 10 will be discussed in detail below.

To simplify this description, the measuring circuit 16 is connected to an electrical cable 12 comprising three electrical wires $14_1$, $14_2$, $14_3$.

In this figure, it can be seen that the measuring stage 20 is connected to the switching stage 25. The figure also shows the looping stage 28, also referred to as a 'plug', connected to the second terminal of each wire $14_1$, $14_2$, $14_3$.

The metal armor of the cable 12, electrically connected to the grounds of the connectors of the cable 12, is suitable for connecting the measuring stage 20 to the looping stage 28. For ease of understanding, the armour of the cable 12 is shown by a wire 41 in FIG. 2. The wire 41 is connected to ground m.

The switches $25_1$, $25_2$, $25_3$, $25_m$, $26_1$, $26_2$, $26_3$, $26_m$ of the switching stage 25 form pairs of switches, i.e. ($25_1$-$26_1$), ($25_2$-$26_2$), ($25_3$-$26_3$), ($25_m$-$26_m$). One of the terminals of each pair of switches is suitable for being connected to the first terminal of each electrical wire $14_1$, $14_2$, $14_3$ or the wire 41, respectively. The other terminal of each pair of switches is suitable for being connected to the measuring stage 20.

In other words, one of the terminals of each switch $25_1$, $25_2$, $25_3$, $26_1$, $26_2$, $26_3$ is connected to the measuring stage 20, and the other terminal of each switch $25_1$, $25_2$, $25_3$, $26_1$, $26_2$, $26_3$ is suitable for being connected in series to the first terminal of each electrical wire $14_1$, $14_2$, $14_3$, respectively.

Each switch $25_1$, $25_2$, $25_3$, $25_m$, $26_1$, $26_2$, $26_3$ is suitable for being automatically controlled between two positions $p_1$, $p_2$. In the open position $p_1$, the current i is not able to traverse the electrical wire $14_1$, $14_2$, $14_3$ to which each pair of switches $25_1$-$26_1$, $25_2$-$26_2$, $25_3$-$26_3$ is suited to be connected, the switches $25_1$, $25_2$, $25_3$, $26_1$, $26_2$, $26_3$ not connecting the wire $14_1$, $14_2$, $14_3$ to the measuring circuit 16. In the closed position $p_2$, the electrical current i is able to circulate via the electrical wire $14_1$, $14_2$, $14_3$ to which one of the switches of each pair of switches $25_1$-$26_1$, $25_2$-$26_2$, $25_3$-$26_3$ is respectively connected, the switches $25_1$, $25_2$, $25_3$, $26_1$, $26_2$, $26_3$ being configured to connect the wire $14_1$, $14_2$, $14_3$ to the measuring circuit 16.

For each wire $14_1$, $14_2$, $14_3$, the looping stage 28 comprises a branch $40_1$, $40_2$, $40_3$, with each branch $40_1$, $40_2$, $40_3$ comprising a diode $30_1$, $30_2$, $30_3$ that is connected in series to a resistor $32_1$, $32_2$, $32_3$. The three resistors $32_1$, $32_2$, $32_3$ have the same value R.

Additionally, the wire 41 connects the measuring stage 20 to the first branch $40_1$ of the looping stage 28 via the switching stage 25.

Thereafter, it should be noted that the anode and the cathode of a diode $30_1$, $30_2$, $30_3$ are defined in relation to the forward direction of the diode $30_1$, $30_2$, $30_3$.

More specifically, the anode of each diode $30_1$, $30_2$, $30_3$ is respectively connected to the resistor $32_1$, $32_2$, $32_3$ of the same branch $40_1$, $40_2$, $40_3$, and the cathode of each diode $30_1$, $30_2$, $30_3$ is connected to the second terminal of each wire $14_1$, $14_2$, $14_3$.

Additionally, the anode of the diode $30_2$ of the second branch $40_2$ is connected to the cathode of the diode $30_1$ of the first branch $40_1$ via the resistor $32_2$ of the second branch $40_2$, and the anode of the diode $30_3$ of the third branch $40_3$ is connected to the cathode of the diode $30_2$ of the second branch $40_2$ via the resistor $32_3$ of the third branch $40_3$.

In other words, the resistor $32_2$ of the second branch $40_2$ is connected between the first wire $14_1$ and the diode $30_2$ of the second branch $40_2$, and the resistor $32_3$ of the third branch $40_3$ is connected between the second wire $14_2$ and the diode $30_3$ of the third branch $40_3$.

Thus, the anode of the diode $30_1$ of the first branch $40_1$ is connected to ground m via the resistor $32_1$ and the wire 41. The cathode of the diode $30_1$ is connected to the anode of the diode $30_2$ of the second branch $40_2$ via the resistor $32_2$. The cathode of the diode $30_2$ is connected to the anode of the diode $30_3$ of the third branch $40_3$ via the resistor $32_3$.

In the embodiment shown in FIG. 2, the monitoring device 10 is suitable for monitoring the continuity of the cable 12.

The ground m, which is suited to be connected to the measuring stage 20 via the switch $25_m$ or $26_m$, and the ground m of the looping stage 28 are all connected to one another, and can be switched to one of the poles of the voltage generator 22 by means of the switches $25_m$ or $26_m$. In this example, during the continuity measuring phase, the switch $26_m$ is closed, and the switch $25_m$ is open. Thus, the wire 41 is connected to the positive pole of the measuring stage 20, so as to form a closed circuit in case of continuity of the tested wire.

The voltage generator 22 is galvanically isolated from any voltages present in the electrical system of the naval vessel being monitored in order to ensure the protection of persons from electrical hazards and avoid any disruption of the measurements. For example, this requirement can be met by using a battery as a power source for the voltage generator 22.

Additionally, given the polarity of the measuring circuit 16 determined by the voltage generator 22, as shown in FIG. 2, the looping stage 28 is configured in resistive mode.

In this mode, the diodes $30_1$, $30_2$, $30_3$ are turned on. In other words, the current i, as shown in FIG. 2, is able to circulate within the wire 41 and within each branch $40_1$, $40_2$, $40_3$.

The sequencer 27 is suitable for connecting/disconnecting any of the wires $14_1$, $14_2$, $14_3$ automatically (i.e. without the manual intervention of an operator).

Each wire $14_1$, $14_2$, $14_3$ is identified by its reference number n. In the example of FIG. 2, n={1,2,3}, in other exemplary embodiments, n={1, . . . , k} where k=63.

When the wire $14_1$ (i.e. the wire having the reference number 1) is connected to the measuring circuit 16, the wire $14_1$ is connected in series to the first branch $40_1$, and the other wires $14_2$ and $14_3$ are not connected to the measuring circuit 16. Only one resistor $32_1$ of the feedback circuit 28 is connected to the measuring circuit 16.

When the wire $14_2$ (i.e. the wire having the reference number 2) is connected to the measuring circuit 16, the wire $14_2$ is connected in series to the first branch $40_1$, and the other wires $14_1$, $14_3$ are not connected to the measuring circuit 16. The current i is capable of traversing the first branch $40_1$ and the second branch $40_2$, connecting the resistors $32_1$ and $32_2$ to the measuring circuit 16.

Lastly, when the wire $14_3$ (i.e. the wire having the reference number 3) is connected to the measuring circuit 16, the wire $14_3$ is connected in series to the first, second, and third branches $40_1$, $40_2$, $40_3$, and the other wires $14_1$, $14_2$ are not connected to the measuring circuit 16. The current i is able to traverse the three branches $40_1$, $40_2$, $40_3$ of the looping stage 28, connecting the resistors $32_1$, $32_2$, and $32_3$ of the looping stage 28 to the measuring circuit 16.

Depending on the wire identified $14_1$, $14_2$, $14_3$ connected to the measuring circuit 16, or, in other words, depending on the reference number n of the wire $14_1$, $14_2$, $14_3$ connected to the measuring circuit 16, a predetermined number of resistors $32_1$, $32_2$, and $32_3$ is connected to the measuring circuit 16.

In the exemplary embodiment of FIG. 2, the number of resistors $32_1$, $32_2$, $32_3$ connected to the measuring circuit 16 corresponds to the reference number n of the wire $14_n$ connected to the measuring circuit 16.

Thus, in this example, the greater the reference number n of the wire $14_n$, the greater the number of resistors with which the wire $14_n$ is connected to the measuring circuit 16.

In other words, in the measuring circuit 16 according to the invention, in the resistive mode associated with testing the continuity of the cable 12, a resistance gradient is generated within the looping stage 28 depending on the reference number n of the wire 14 of the cable 12. In fact, the more wire-to-wire connections there are with the wires $14_1$, $14_2$, $14_3$, the more resistors $32_1$, $32_2$, $32_3$ will be connected to the measuring circuit 16.

The measurement voltage Umes at the terminals of the measuring resistor 24 is equal to:

$$Umes = \frac{Rmes + U}{Rmes + n * R} \qquad (1)$$

wherein Rmes is the value of the measuring resistor 24, U is the voltage generated by the voltage generator 22, n is the reference number of the wire $14_1$, $14_2$, $14_3$ connected to the measuring circuit 16 or, in other words, the number of resistors $32_1$, $32_2$, $32_3$ having the same value of the looping stage 28 that are connected to the measuring circuit 16, and R is the common value of the resistors $32_1$, $32_2$, $32_3$ connected to the measuring circuit 16.

The value R of each resistor $32_1$, $32_2$, $32_3$ is, for example, 180Ω.

The voltage at the terminals of the measuring resistor 24 is able to be measured, and representative of the quality of the continuity of each electrical wire $14_1$, $14_2$, $14_3$ of the cable 12. In other words, 'quality' refers to the satisfactory continuity of a wire $14_1$, $14_2$, $14_3$ or a continuity fault of a wire $14_1$, $14_2$, $14_3$ of the cable 12.

If the wires $14_1$, $14_2$, $14_3$ show no continuity failure, the voltage measurement Umes measured at the terminals of the measuring resistor 24 for each wire $14_1$, $14_2$, $14_3$ connected to the measuring circuit 16 is consistent with formula (1).

In one embodiment, the monitoring device 10 is suitable for monitoring the insulation of the cable 12.

By default, all of the switches $25_1$, $25_2$, $25_3$, $25_m$, $26_1$, $26_2$, $26_3$, $26_m$ are open, i.e. they are in the position $p_1$. In the open position $p_1$, the switches insulate the wires $14_1$, $14_2$, $14_3$ of the measuring stage 20 being monitored.

When the insulation of the cable 12 is tested by the monitoring device 10, the polarity of the voltage generator 22 is suited to be inverted via the switching stage 25 relative to its polarity in the case of a continuity test. The reversal of the polarity of the voltage generator 22 causes the looping stage to operate in insulating mode. In other words, the feedback circuit 28 insulates the wires $14_1$, $14_2$, $14_3$ from one another.

More specifically, the polarity of the looping stage 28 in the insulating mode is thus also reversed compared to its polarity in the resistive mode. The direction of the current i is then reversed compared to the direction of circulation of the current i shown in FIG. 2. The diodes $30_1$, $30_2$, $30_3$ are blocked, and the current i cannot circulate in the looping stage 28. The looping stage 28 thus has no functional effect in this mode.

The sequencer 27 generates switching commands depending on which of the wires $14_1$, $14_2$, $14_3$, 41 is being tested.

To measure the insulation between the wire $14_1$ and the wire $14_2$, the sequencer 27 closes the switches $25_1$ and $26_2$, which then connect the wire $14_1$ to the negative pole of the measuring stage 20 and connect the wire $14_2$ to the positive pole of the measuring stage 20. If there is an insulation failure between the two wires $14_1$, $14_2$, a fault current will circulate between these two wires, and a voltage will appear on the lowest resistor of the divider bridge of the measuring stage 20. This voltage will be proportional to the fault current, from 0 V, if the insulation is infinite, to 5 V, if the insulation is nil. Following the measurement, the switches $25_1$ and $26_2$ are opened by the sequencer 27.

To measure the insulation between the wire $14_1$ and the wire $14_3$, the sequencer 27 will close the switches $25_1$ and $26_3$, which then connect the wire $14_1$ to the negative pole of the measuring stage 20 and the wire $14_3$ to the positive pole of the measuring stage 20. If there is an insulation failure between the two wires $14_1$, $14_3$, a fault current will circulate between these two wires, and a voltage will appear on the lowest resistor of the divider bridge of the measuring stage 20. This voltage will be proportional to the fault current, from 0 V, if the insulation is infinite, to 5 V, if the insulation is nil. Following the measurement, the switches $25_1$ and $26_3$ are opened by the sequencer 27.

To measure the insulation between the wire $14_2$ and the wire $14_3$, the sequencer 27 closes the switches $25_2$ and $26_3$, which then connect the wire $14_2$ to the negative pole of the measuring stage 20 and connect the wire $14_3$ to the positive pole of the measuring stage 20. If there is an insulation failure between the two wires $14_2$, $14_3$, a fault current will circulate between these two wires, and a voltage will appear on the weakest resister of the divider bridge of the measuring stage 20. This voltage will be proportional to the fault current, from 0 V, if the insulation is infinite, to 5 V, if the insulation is nil. Following the measurement, the switches $25_2$ and $26_3$ are opened by the sequencer 27.

To measure the insulation between the wire $14_1$ and the armour of the cable 12, the sequencer 27 closes the switches $26_1$ and $25_m$, which connect the wire $14_1$ to the positive pole of the measuring stage 20 and connect the wire 41 to the positive pole of the measuring stage 20. There is no current circulating over the resistor $32_1$, and the diode $30_1$ of the looping stage 28 due to the reverse voltage on the diode $30_1$. If there is an insulation failure between the wire $14_1$ and the armour of the cable 12, represented by the wire 41, a fault current will circulate between these two wires, and a voltage will appear on the lowest resistor of the divider bridge of the measuring stage 20. This voltage will be proportional to the fault current, from 0 V, if the insulation is infinite, to 5 V, if the insulation is nil. Following the measurement, the switches $26_1$ and $25_m$ are opened by the sequencer 27.

The sequencer 27 allows for the generation of all possible permutations (measurement between the wire having the reference number 1 and the wire having the reference number 2, the wire having the reference number 1 and the wire having the reference number 3, the wire having the reference number 1 and the wire having the reference number n, the wire having the reference number 2 and the file having the reference number 3, the wire having the reference number 2 and the wire having the reference number n). The sequencer 27 also generates the switching sequences for the insulation measurements between the wire having the reference number 1 and the wire 41 (representing the armour of the cable 12), the wire having the reference number 2 and the wire 41, . . . the wire having the reference number n and the wire 41. The switches $25_m$ and $26_m$ that connect the armour of the cable, represented by the wire 41, are controlled by the 64th path of the sequencer 27 when k=63.

For automatic monitoring of insulation and/or continuity, the monitoring device 10 is activated via the user interface 18.

FIG. 3 shows a human-machine interface (IHM) 50 suitable for being displayed on the screen 36 of the user interface 18 to configure the test to be carried out on the cable 12.

The interface IHM 50 comprises a first field "C" 52, in which identification data of the cable 12 to be tested can be entered and/or referenced from a cable reference list. The value of the identification information of the cable 12 to be tested is, for example a function of the cable 12, an ID number of the cable 12 appearing on the circuit diagrams of the system.

The interface IHM 50 has a second field "V" 54, in which the value of the insulation voltage U generated by the voltage generator 22 can be entered and/or selected from a selection of voltage U levels. For example, when the field 54 is activated by the finger of an operator, a drop-down menu can be shown, listing three choices for the voltage U, 50 V, 250 V, and 500 V.

The interface IHM 50 also has fields "$F_d$" 56 and "$F_a$" 58, in which identification information, for example the reference number n, of starting electrical wire 14$_1$ and identification information, for example the reference number n, of a destination wire 14$_3$ are entered. In other words, the identification of the starting wire and the selection of the destination wire determine the list and the order of the wires 14 of the cable 12 that can be tested one by one by the monitoring device 10.

This list of the wires of the cable 12 to be tested is intended to be sent to the sequencer 27 by the automatic control of the switches 25$_1$, 25$_2$, 25$_3$, 25$_m$ and 26$_1$, 26$_2$, 26$_3$, 26$_m$ of the switching stage 25.

The interface IHM 50 additionally has buttons to select a type of measurement to be carried out by the monitoring device 10 from three types of measurement.

The interface IHM 50 comprises, for example, a first touch button 60 for the first type of measurement. When the first type of measurement is selected, the monitoring device 10 automatically and successively monitors the continuity of the cable 12 and then monitors the insulation of the cable 12.

In one variant, when the first type of measurement is selected, insulation is tested before testing continuity.

The interface IHM 50 comprises, for example, a second touch button 62 for the second type of measurement. When the second button 62 is selected, the monitoring device 10 can monitor only the insulation of the cable 12.

Lastly, the interface IHM 50 comprises, for example, a third touch button 64 control. When the third button 64 is selected, the monitoring device 10 can monitor only the continuity of the cable 12.

FIG. 4 shows an interface IHM 66 that can be displayed on the screen 36 during an insulation or continuity test.

The interface IHM 66 comprises a first field "$C_c$" 67 identifying the cable 12 being tested by the monitoring device 10, a second field "T" 68 indicating the current test, either an insulation test or a continuity test, and a third field "$n_c$" 69 indicating the reference number(s) n of the wire(s) 14 being tested.

If the continuity of the cable 12 is being tested, the reference number n of the wire connected to the measuring circuit 16 is indicated. For example, if the list of cables 12 to be tested includes the three wires 14$_1$, 14$_2$, 14$_3$, the reference numbers 1, 2, and 3 will be successively displayed in the field 69 at the same time as the corresponding wire 14$_1$, 14$_2$, 14$_3$ is connected to the measuring circuit 16 by the switching stage 25.

If the insulation of the cable 12 is being tested the identifiers of the pairs of wires 14$_1$, 14$_2$, 14$_3$, or 41 connected to the measuring circuit 16 are indicated. For example, these identifiers comprise the reference number n of the electrical wire(s) 14$_1$, 14$_2$, 14$_3$ of the cable 12 that is/are connected to the measuring circuit 16, and the letter m to identify the connection of the armour of the cable 12, represented by the wire 41, to the measuring circuit 16.

With each new connection of a wire 14$_1$, 14$_2$, 14$_3$, 41, the identifiers of the pairs of wires 14$_1$, 14$_2$, 14$_3$, 41 connected to the measuring circuit 16 are updated in the field 69.

For example, the interface IHM 66 has green indicators 70$a$, orange indicators 70$b$, and red indicators 70$c$ that can be displayed during an insulation or continuity test, representing the nature of the current test.

In some exemplary embodiments, the interface IHM 66 comprises a field 70$d$, in which the insulation and/or continuity faults respectively detected during an insulation and/or continuity test can be displayed.

In the case of an insulation test, the field 70$d$ can identify the wires 14$_1$, 14$_2$, 14$_3$, 41 of the cable 12, using their reference numbers n, for which an insulation fault has been detected.

In the case of a continuity test, the field 70$d$ can identify the wire of the cable 12, for example using their reference numbers n, for which a continuity fault has been detected.

The interface IHM 66 comprises a touch button 71 that can stop the current test whilst it is active.

FIGS. 5 and 6 respectively show a front and rear view of a first housing 72 of the monitoring device 10.

The first housing 72 comprises the measuring stage 20, the switching stage 25, the sequencer 27, and the user interface 18.

The first housing 72 also includes an autonomous battery (not shown), for example a lithium ion (Li-ions) battery. Advantageously, the autonomous battery, which is configured to supply the voltage generator 22, is adapted to generate the voltage U of the measuring stage. The battery allows for the voltage generator to be galvanically isolated from the system being measured. The autonomous battery can be connected to an external charging device by means of a removable cable using a connector 74. This charging device is also galvanically isolated from the system being measured in order to carry out measurements whilst charging the removable battery.

By reference to FIG. 5, the user interface 18 is arranged on the front surface of the first housing 72 so as to be accessible and visible to an operator.

The front surface of the first housing 72 also includes connectors such as USB 74 connectors, for example to connect the monitoring device 10 to a computer, as well as other connectors 76.

In particular, in one variant, the monitoring device 10 comprises an external voltage generator 22 connected via the connector 76 to the monitoring device 10. The monitoring device 10 then comprises a voltage generation stage external to the first housing 72, such as a megohmmeter, for example the MEGGER MIT megohmmeter 430.

The front surface of the first housing 72 also comprises at least one handle 80 suitable for being held by an operator. Thus, the device 10 according to the invention, distributed over two housings 72, 90 is easily portable.

By reference to FIG. 6, the rear surface of the first housing 72 includes different types of connector sockets 82 suitable for connecting a first end of the various types of cables 12 to test, which vary, in particular, in terms of cross-sectional size.

In particular, if the connectors of the cables 12 to be measured are compatible, the cables are connected to the connector sockets 82 directly or via electrical jumper cables, as appropriate.

The first housing 72 is made of a resistant and lightweight material, for example aluminium.

For example, the first housing 72 has a length of 400 mm, a width of 300 mm, a height of 3300 mm, and a weight less than 10 kg.

By reference to FIG. 7, a second housing 90 of the monitoring device 10 is shown. The second housing 90 includes the looping stage 28.

The second housing 90 also comprises various types of connector sockets 92 suitable for connecting the other end of the various types of cables 12 to be tested. The second housing also includes a handle 94.

The second housing 90 is made of a resistant and lightweight material, for example, aluminium, and also weighs less than ten kg.

The ground m for connection to the measuring stage 20 via one or the other of the switches $25_m$ or $26_m$ and the ground m of the looping stage 28 respectively correspond to the grounds of the two housings 72 and 90. The grounds of the two housings 72 and 90, as well as all of the metal components (connector caps, mounting parts, etc.) are all suitable for being connected with one another.

The monitoring device 10 is thus compact, energy independent and easily portable. The device 10 is particularly suited for the test of cables 12 in tight spaces, such as passageways on naval vessels.

Below, a method for testing the electrical insulation and/or continuity of the cable 12 will be described.

By means of configuration menus that can be shown on the user interface 18, the user enters the parameters of the measurement sequence into the user interface 18: The nature of the test (insulation or continuity), the test voltage U for the insulation test, the number of wires 14 of the cable 12. This information is saved and processed by the sequencer 27, which addresses the switches, carries out the measurements, and saves the results.

More specifically, in a first step of the method, the monitoring device 10 receives input entered by an operator via the user interface 18 of the monitoring device 10.

In particular, the operator fills in at least the field 52 on the interface IHM 50 to identify the cable 12 to be tested and the field 56 identifying the wire $14_1$ as the starting wire and the field 58 identifying the wire $14_3$ as the destination wire. The selection of the starting wire $14_1$ and that of the destination wire $14_2$ creates an ordered list of wires to be tested. In this case, the list of wires to be tested comprises three wires 14.

If an insulation test is to be carried out on the cable 12, the insulation voltage U is selected. When the operator presses on a field 54, a drop-down menu comprising three options for the voltage U, 50V, 250V, or 500V will open. The insulation voltage U selected by the operator depends on the cable 12 being tested.

If the operator only wishes to carry out a continuity test, the field 54 does not to be filled in, because a preset voltage U for the continuity test will be automatically generated.

Then, the operator selects a type of test to carry out from the three types of test possible, either an insulation test and a continuity test carried out automatically and successively, one after another, or vice versa by selecting the button 60, an insulation test by selecting the button 62 or a continuity test by selecting the button 64.

Thus, depending on the value of the input, i.e. the reference number n of the starting wire, the reference number n of the destination wire, and the selection of the type of measurement, a continuity and/or insulation measurement will be automatically activated.

More specifically, if the operator selects a continuity measurement, the looping stage 28 will automatically enter the resistive mode.

Over the entire continuity measurement, the switching stage 25 places the switch $26_m$ in the closed position $p_2$ in order to connect the wire 41 to the measurement circuit 16, and, more specifically, to the positive pole of the voltage generator 22.

Then, the switching stage 25 will automatically and successively cause the opening and closing of the switches $25_1$, $25_2$, $25_3$ in order to connect and disconnect, wire to wire, each wire 14 from the list of wires to the measurement circuit 16.

More specifically, the first switch $25_1$ is placed in the closed position $p_2$ to connect the first wire $14_1$ to the measurement circuit 16, and the other switches $25_2$ and $25_3$, $26_1$, $26_2$, $26_3$ and $25_m$ are placed in the open position $p_1$. A single resistor $32_1$ is connected to the measuring circuit 16.

Then, the second switch $25_2$ is placed in the closed position $p_2$ to connect the second wire $14_2$ to the measurement circuit 16, and the other switches $25_1$, $25_3$, $26_1$, $26_2$, $26_3$, and $25_m$ are placed in the open position $p_1$. The two resistors $32_1$ and $32_2$ are connected to the measurement circuit 16.

Lastly, the third switch $25_3$ is placed in the open position $p_1$ to connect the third wire $14_3$ to the measurement circuit 16, and the other switches $25_2$, $26_1$, $26_2$, $26_3$, and $25_m$ are placed in the open position $p_1$. The three resistors $32_1$, $32_2$, $32_3$ are connected to the measurement circuit 16.

Thus, each time a wire $14_1$, $14_2$, $14_3$ is connected, the resistance value of the measurement circuit 16 is increased.

The voltage U generated by the voltage generator 22 is fixed at approximately ten volts in this embodiment. The measuring stage 20 detects an increase in voltage Umes proportional to the reference number n of the switched wire in increments of approximately 80 mV.

Each time a new wire $14_1$, $14_2$, $14_3$, of the list of wires of the cable 12 to be tested is connected, the voltage Umes at the terminals of the measuring resistor 24 is measured.

If the voltage Umes does not correspond to the voltage Umes calculated with the formula (1) above, a continuity fault is identified in the wire $14_1$, $14_2$, $14_3$. In particular, the variation in voltage Umes measured is to be shown on the screen 36. A regular variation in the voltage Umes indicates that there is no continuity fault. Otherwise, in the event of a continuity fault in a wire $14_1$, $14_2$, $14_3$, an irregularity in the variation of the voltage Umes will be observed. By saving the measurement data via the microcontroller and transferring them to a computer, the precise origin of the faults can subsequently be determined: Detection of boundary faults, crossed wires, for example, which are characteristic of insulation faults, as well as breaks in the continuity of the wires 14).

The number Ncc of continuity tests is equal to the number LF of wires on the list of wires to test, where LF is less than or equal to the number k of wires 14 of the cable 12.

If an operator selects an insulation test after the continuity of the cable 12 has been tested, the polarity of the voltage generator 22 will be automatically reversed according to the invention at the transition to the insulation measurement, causing a reversal in the polarity of the looping stage 28. The looping stage is switched to the insulating mode, and the diodes $30_1$, $30_2$, $30_3$ are turned off.

For the insulation measurement, the switching module 25 automatically and successively connects the first wire $14_1$ of the list of wires to be tested to the armour of the cable 12, represented by the wire 41 in FIG. 2, and then with the other wires $14_2$, $14_3$ of the list, one by one.

More specifically, the first switch $26_1$ and the switch $25_m$ of the armour of the cable, represented by the wire 41, are placed into the closed position $p_2$ to connect the first wire $14_1$ of the measurement circuit 16 and the wire 41 of the measurement circuit 16. In this case, the other switches $25_1$, $25_2$, $25_3$, $26_2$, $26_3$, $26_m$ are in the open position $p_1$.

Then, the first switch $25_1$ and the second switch $26_2$ are placed in the closed position $p_2$ to connect the first wire $14_1$ and the second wire $14_2$ to the measurement circuit 16. In this case, the other switches $25_2$, $25_3$, $25_m$, $26_1$, $26_3$, and $26_m$ are in the open position $p_1$.

Lastly, the first switch $25_1$ and the third switch $26_3$ are placed in the closed position $p_2$ to connect the first wire $14_1$ and the third and last wire $14_3$ of the list to the measurement circuit 16. In this case, the other switches $25_2$, $25_3$, $25_m$, $26_1$, $26_2$, and $26_m$ are in the open position $p_1$.

Once the insulation of the first wire $14_1$ from the other wires of the cable 12, including the wire 41, representing the armour of the cable 12, has been tested, the sequencer 27 places the switch $25_2$ into the closed position $p_2$ to connect the next wire $14_2$ to the measurement circuit 16, and places the switch $26_3$ into the closed position $p_2$ to test the insulation of the wire $14_2$ from the wire $14_3$. Then, the switches $26_2$ and $25_m$ are placed into the closed position $p_2$ to test the insulation between the wire $14_2$ and the armour of the cable 12, represented by the wire 41.

Lastly, the sequencer 27 places the switches $26_3$ and $25_m$ into the closed position $p_2$ in order to test the insulation between the wire $14_3$ and the armour of the cable 12.

The number Nd of tests to carry out is equal to $$Nci = \frac{LF*(LF+1)}{2}$$

Where LF is the number of wires 14 on the list of wires of the cable 12 to be tested. The number LF of wires 14 of the list of wires of the cable 12 to be tested is less than or equal to the number k of wires 14 of the cable 12.

The number Nci of insulation tests to carry out corresponds to the number of simultaneous connections of two wires $14_1$, $14_2$, $14_3$ of the cable 12 and of one wire of the cable $14_1$, $14_2$, $14_3$ with the armour of the cable 12.

Each time a wire $14_1$, $14_2$, $14_3$, from the list of wires of the cable 12 to be tested is connected, the voltage Umes at the terminals of the measuring resistor 24 is measured in order to detect a fault in the insulation between the wires or between the wires and the wire 41 connected to ground m.

When the operator selects successive and automatic testing of continuity and insulation, or vice versa, once the device 10 has completed the continuity test, the polarity of the looping stage 28 is automatically reversed by automatic reversal of the polarity of the voltage generator 22.

Thus, according to the invention, continuity and/or insulation is tested in a particularly reliable manner. In fact, the successive connection of the various wires of the cable from the list of cables to be tested is carried out automatically, and wire connection errors are avoided.

Furthermore, the initial setting of the voltage U for the insulation and continuity testing also ensures the reliability of the measurements, because the voltage reading associated with the cable 12 being tested is automatically selected.

Thus, the cables are tested quickly and simply. This is particularly advantageous in the naval field, where very large numbers of cables must be tested.

The invention claimed is:

1. A monitoring device for monitoring the insulation and/or continuity of at least one electric cable, which includes a plurality of electrical wires, the monitoring device comprising a measuring circuit configured to be connected to the electrical wires of the cable, wherein the measuring circuit comprises:
a measuring stage comprising at least one voltage generator;
a switching stage configured to be connected to the measuring stage and to connect each electrical wire automatically and successively to the measuring circuit and/or to connect the measuring circuit to ground; and
a looping stage of the measuring circuit configured to be connected, electrical wire to electrical wire of the cable, to the switching stage, and wherein the looping stage is configured to operate automatically in at least one of two modes, insulating or resistive, respectively associated with the monitoring of the insulation or the monitoring of the continuity of the electrical cable,
wherein the polarity of the looping stage in the insulating mode is the reverse of the polarity of the looping stage in the resistive mode.

2. The monitoring device according to claim 1, wherein, for each wire, the looping stage comprises at least one component for the unidirectional passage of electrical current, wherein each component for the unidirectional passage of electrical current is turned on when the looping stage is in the resistive mode and is blocked when the looping stage is in the insulating mode.

3. The monitoring device according to claim 2, wherein, for each wire, the looping stage comprises at least one resistor with the at least one unidirectional component.

4. The monitoring device according to claim 1, wherein the switching stage comprises electronic switches.

5. The monitoring device according to claim 4, wherein the electronic switches are CMOS switches.

6. The monitoring device according to claim 4, wherein the electronic switches are automatically controlled by a shift register.

7. The monitoring device according to claim 1, wherein the measuring stage comprises a measuring resistor that is connected in series to the at least one voltage generator, wherein the measuring resistor comprises terminals configured for measuring the voltage at said terminals, wherein said measured voltage is representative of the quality of the insulation and/or the continuity of each electrical wire of the cable.

8. The monitoring device according to claim 1, wherein the voltage generator is a variable voltage generator.

9. The monitoring device according to claim 1, wherein the monitoring device is manually transportable and further comprises a battery.

10. A method for monitoring the insulation and/or continuity of at least one electrical cable, which includes a plurality of electrical wires, the method being automatically carried out by a monitoring device according to claim 1, the method comprising the following steps, carried out automatically by the monitoring device:
receiving input data via an interface of the monitoring device, the input data being representative of the insulating mode and/or the resistive mode of the looping stage;
depending on a value of the input data, automatically activating at least one of the two modes of the looping stage, insulating or resistive, respectively associated with the monitoring of the insulation or the monitoring of the continuity of the electrical cable; and
measuring the voltage at terminals of a measuring resistor of the measuring stage, after the successive connection of each electrical wire of the at least one cable to the measuring circuit by the switching stage of the measuring circuit until an insulation and/or continuity failure of the electrical wire is detected or until all of the electrical wires of the at least one cable are connected.

11. A monitoring device for monitoring the insulation and/or continuity of at least one electric cable, which includes a plurality of electrical wires, the monitoring device comprising a measuring circuit configured to be connected to the electrical wires of the cable, wherein the measuring circuit comprises:
- a measuring stage comprising at least one voltage generator;
- a switching stage configured to be connected to the measuring stage and to connect each electrical wire automatically and successively to the measuring circuit and/or to connect the measuring circuit to ground; and
- a looping stage of the measuring circuit configured to be connected, electrical wire to electrical wire of the cable, to the switching stage, and wherein the looping stage is configured to operate automatically in at least one of two modes, insulating or resistive, respectively associated with the monitoring of the insulation or the monitoring of the continuity of the electrical cable,
- wherein, for each wire, the looping stage comprises at least one component for the unidirectional passage of electrical current, wherein each component for the unidirectional passage of electrical current is turned on when the looping stage is in the resistive mode and is blocked when the looping stage is in the insulating mode.

* * * * *